United States Patent [19]
Yero

[11] Patent Number: 6,038,173
[45] Date of Patent: Mar. 14, 2000

[54] MEMORY READ CIRCUIT WITH DYNAMICALLY CONTROLLED PRECHARGING DEVICE

[75] Inventor: Emilio Miguel Yero, Aix-en-Provence, France

[73] Assignee: SGS-Thomson Microelectronics S.A., Gentilly, France

[21] Appl. No.: 09/059,081

[22] Filed: Apr. 13, 1998

[30] Foreign Application Priority Data

Apr. 16, 1997 [FR] France ................................. 97 04927

[51] Int. Cl.⁷ ............................................. G11C 16/06
[52] U.S. Cl. ........................... 365/185.25; 365/185.07; 365/185.2; 365/189.09
[58] Field of Search ................ 365/185.25, 189.07, 365/185.2, 189.09

[56] References Cited

U.S. PATENT DOCUMENTS

| | | |
|---|---|---|
| 4,370,737 | 1/1983 | Chan ......................................... 365/203 |
| 4,725,984 | 2/1988 | Ip et al. . |
| 5,083,047 | 1/1992 | Horie et al. . |
| 5,432,746 | 7/1995 | Guedj ........................................ 365/202 |
| 5,563,826 | 10/1996 | Pascucci et al. .................... 365/185.21 |
| 5,859,798 | 1/1999 | Yero .................................. 365/185.25 |

FOREIGN PATENT DOCUMENTS

| | | | |
|---|---|---|---|
| 0 175 101 A2 | 3/1986 | European Pat. Off. | ........ G11C 11/24 |
| 0 643 393 A2 | 3/1995 | European Pat. Off. | .......... G11C 7/00 |

*Primary Examiner*—David Nelms
*Assistant Examiner*—Tuan T. Nguyen
*Attorney, Agent, or Firm*—Theodore E. Galanthay; Allen, Dyer, Doppelt, Milbrath & Gilchrist, P.A.

[57] ABSTRACT

A memory read circuit includes a dynamically controlled precharging device that can be applied in the field of non-volatile (EEPROM, Flash EPROM) memories. The precharging circuit interrupts the precharging of the bit line and the reference line when the potential of the these lines reaches a boundary value referenced with respect to ground.

17 Claims, 3 Drawing Sheets

MEMORY READ CIRCUIT WITH DYNAMICALLY CONTROLLED PRECHARGING DEVICE

FIELD OF THE INVENTION

The present invention relates to memories, and, more particularly, to a memory read circuit with a device to limit the precharging of the bit lines. It can be applied in the field of non-volatile memories (EEPROMs and flash EPROMs).

BACKGROUND OF THE INVENTION

Memories are organized in arrays of cells, the cells of one and the same column being connected to a bit line, and the cells of one and the same row being connected to a word line. The bit line is used to transmit information on the state of a memory cell located at the intersection of this bit line and a selected word line. This information is processed by a read circuit to determine the state of the memory cell.

In an EEPROM memory, the cells may be in a blank state in which they let through a reference electrical current, an erased state in which they let through a current greater than the reference current, or may be in a programmed state in which they counter the passage of a current. To read the information, it is sought to detect the presence of a current flowing in the bit line connected to a cell to be read. A current of this kind is present if the cell is erased or blank. Otherwise it is programmed.

To detect the presence of the current, a reference line similar to the bit line is used. This reference line is crossed by the reference current during a reading phase. This reference current may be provided, for example, by a reference cell. The phase for the reading a memory cell is preceded by a phase for the precharging the bit line and the reference line. During this phase, the bit line and the reference line are precharged at a potential of about 1 volt. This potential is limited to 1 volt to prevent any stress on the cells connected to the bit line. During the reading phase, the current flowing in the bit line is compared with the reference current to find out whether the cell read is programmed or erased.

FIG. 1 gives a simplified view of a prior art read circuit. A memory cell CM located at the intersection of a word line LM and a bit line LB is selected by the word line and delivers a piece of information on the bit line. In a conventional way, the memory cell CM includes a floating-gate transistor TGF1 series-connected with a selection transistor TS1. The control gate of the selection transistor TS1 is connected to the word line LM, while the control gate of the transistor TGF1 receives a read voltage during the reading phase. The bit line LB is selected by a bit line selection transistor TSLB. The bit line LB is precharged in voltage, during a precharging phase, by a precharging limitation transistor T1 which has the function of providing a precharging current to the bit line, while limiting the precharging potential to a specified value of about 1 volt.

A reference line LR whose characteristics are very similar to those of the bit line LB, especially from the viewpoint of the parasitic capacitance values, is also precharged at a potential of about 1 volt by a precharging limitation transistor T2. In the example of FIG. 1, the reference line LR is connected to a reference cell CR provided by a selection transistor TS2 series-connected with a floating-gate transistor TGF2. During the reading phase, a read voltage is applied to the control gate of the transistor TGF2 and the reference line is then crossed by a reference current.

To limit the precharging of the bit line LB and the reference line LR to 1 volt, the transistors T1 and T2 are looped to themselves by inverter gates INV1 and INV2. Thus, the source and the control gate of the transistor T1 are respectively connected to the input and the output of the inverter gate INV1. Similarly, the source and the control gate of the transistor T2 are respectively connected to the input and to the output of the inverter gate INV2. These four elements form a device to limit the precharging of the lines LB and LR. To obtain the desired precharging potential, the size of the transistors of the inverter gate is determined as a function of the equivalent capacitance of the bit line and of the reference line.

To read the state of the cells, a comparison is made between the current consumed by the bit line and the reference current. More specifically, the current consumed by the bit line is compared with a current that is a fraction of the current consumed by the reference cell. To do this, the drains of the transistors T1 and T2 are supplied by the two arms of a current mirror having a copying ratio k smaller than 1. The first arm of the mirror has a copying transistor T3 and the second arm has a reference transistor T4. The copying transistor T3 tends to copy the current flowing in the reference transistor T4. Conventionally, the copying ratio is equal to ½.

The copying transistor T3 is a P type transistor having its source connected to a supply terminal Vcc, and its drain is connected to the drain of a transistor T1. The reference transistor T4 is, in the same way, a P type transistor whose source is connected to the supply terminal Vcc and whose drain is connected to the drain of the transistor T2. The control gates of the transistors T3 and T4 are connected to each other and the gate of the transistor T4 is connected to its drain.

A differential amplifier AD has its inputs connected to the drains of the transistors T3 and T4 and measures the difference between the potentials at these two drains. This difference is zero if the currents flowing in the transistors T3 and T4 have a ratio equal to k. The output of the amplifier AD gives a signal indicating whether the ratio between the currents is greater than k or smaller than k.

To accelerate the precharging of the bit line and the reference line, the read circuit is complemented by two precharging transistors T5 and T6. These transistors are controlled by a precharging signal PREC that is active during the precharging phase and they enable a voltage close to the supply voltage to be applied to the drains of the precharging transistors T1 and T2 during the precharging phase. These transistors generally have very low resistivity so as not to increase the precharging time of the bit line or the reference line.

The pulse of the precharging signal PREC applied to the gates of the transistors T5 and T6 has a fixed duration. This duration takes into account several parameters. Indeed, the precharging time of a bit line may vary as a function of the temperature or of the variable capacitance of the cells to which it is attached. The duration of the pulse is therefore chosen so as to ensure complete precharging whatever the value of these parameters. The precharging option chosen in this type of read circuit is that of precharging the bit line for a predetermined duration and of limiting the precharging voltage to a boundary value.

The main drawback of this type of circuit is that the operation of the precharging limitation device provided by the transistors T1, T2 and the inverters INV1, INV2 does not work satisfactorily when the read circuit is supplied with a low voltage, in the range of 1.8 volts.

SUMMARY OF THE INVENTION

In view of the foregoing background, an object of the invention is to provide a read circuit for a non-volatile memory of the type comprising a matrix of memory cells, the read circuit being connected, firstly, to these memory cells by means of at least one bit line and, secondly, to a reference cell by means of a reference line, the read circuit comprising means to precharge the bit line and the reference line. Moreover, the precharging means preferably comprises means to interrupt the precharging of the bit line and the reference line when the potential of these lines reaches a boundary value referenced with respect to the ground.

According to one embodiment of the invention, the precharging means preferably comprises:

a circuit for the comparison of the precharging potential of the bit line and reference line with the boundary value, the comparison circuit delivering a comparison signal, precharging transistors to precharge the bit line and reference line, and means to control the precharging transistors, these control means receiving the comparison signal and a precharging signal with a constant period and providing a control signal to the precharging transistors.

According to a particular embodiment, the comparison circuit preferably comprises:

a first N type transistor having its drain connected to a supply terminal of the read circuit, its gate connected to the bit line, and its source connected to the current source, and a second N type transistor having its gate connected to the source of the first transistor, its source connected to the ground, the drain of this second N type transistor delivering the comparison signal.

Furthermore, according to a particular embodiment, the control means may comprise:

a NAND type gate having a first input connected to the drain of the second transistor and a second input receiving the precharging signal with a constant period, a third P type transistor having its gate and drain respectively connected to the output and to the first input of the NAND gate and its source connected to the supply terminal of the circuit, a fourth P type transistor having its drain and gate respectively connected to the first and second inputs of the NAND gate and its source connected to the supply terminal of the circuit, and an inverter gate whose input is connected to the output of the NAND gate and whose output is connected to the gate of the precharging transistors.

BRIEF DESCRIPTION OF THE DRAWINGS

Other features and advantages of the invention shall appear from the following detailed description, made with reference to the appended drawings, of which.

DETAILED DESCRIPTION OF THE PREFERRED EMBODIMENTS

Figure 2:
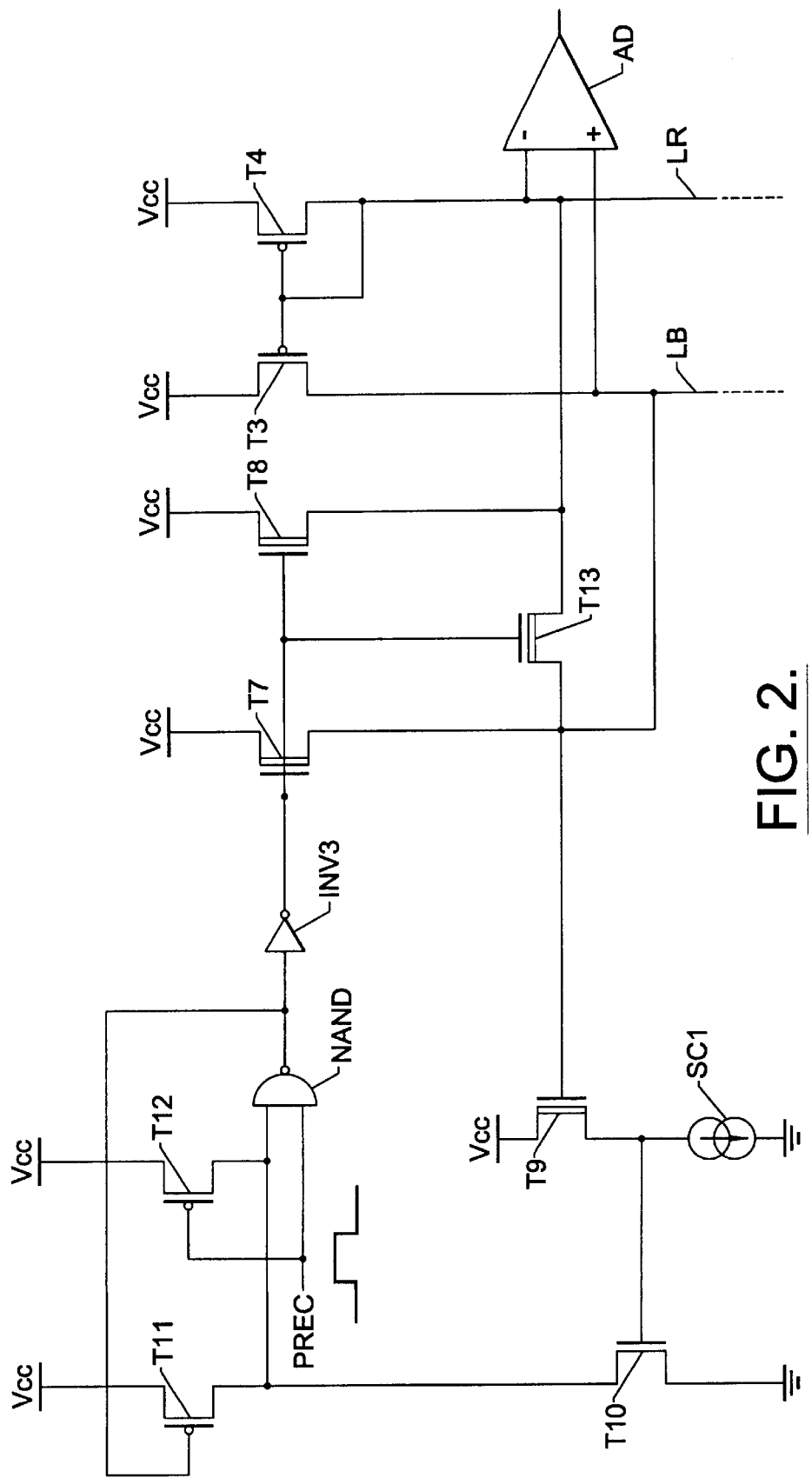
FIG. 2 shows a read circuit according to a first embodiment of the invention.

FIG. 2 shows a first embodiment of a read circuit according to the invention. According to the invention, during the precharging step, the precharging potential of the bit line and reference line is connected with a boundary value. As soon as the precharging potential goes beyond this value, the precharging step is stopped. Thus, the bit line and the reference line LR are precharged only for the time necessary.

According to FIG. 2, the precharging means comprises:

a circuit to compare the potential of the bit line and reference line with a boundary value, this comparison circuit delivering a comparison signal, precharging transistors to precharge the bit line and the reference line, and means to control the precharging transistors, the control means receiving the comparison signal and a precharging signal and giving a control signal to the precharging transistors.

The comparison means is provided by two N type transistors T9 and T10 and one current source SC1. The drain of the transistor T9 is connected to the supply terminal Vcc of the read circuit and its source is connected, firstly, to the current source SC1 and, secondly, to the gate of the transistor T10. The source SC1 is designed to accurately bias the transistor T9. Furthermore, the potential of the bit line LB is applied to the gate of the transistor T9. Finally, the source of the transistor T10 is connected to ground. Thus, when the potential of the bit line LB is greater than the sum of the threshold voltages of the transistors T9 and T10, the transistor T10 comes on and the potential present at the drain of this transistor becomes somewhat equal to that of ground. The size of the transistors T9 and T10 is chosen so that the sum of their threshold voltages is equal to 1 volt. This value corresponds to the desired precharging boundary value. To obtain this size, therefore, a transistor T9 that is a native transistor has been chosen.

The information delivered by the comparison circuit is then processed by the control means. In the example of FIG. 2, the control means has two transistors T11 and T12 whose drains are connected to the supply terminal Vcc and whose sources are connected to the first input of a NAND type gate. The first input of the NAND gate also receives information from the comparison circuit and the second input of the NAND gate receives the precharging charge signal PREC. This signal is also applied to the gate of the transistor T12. The output signal of the NAND gate is applied to the gate of the transistor T11. It is furthermore inverted by means of an inverter gate INV3 and applied to the gate of two transistors T7 and T8 designed to precharge the bit line LB and the reference line LR.

Figure 1:
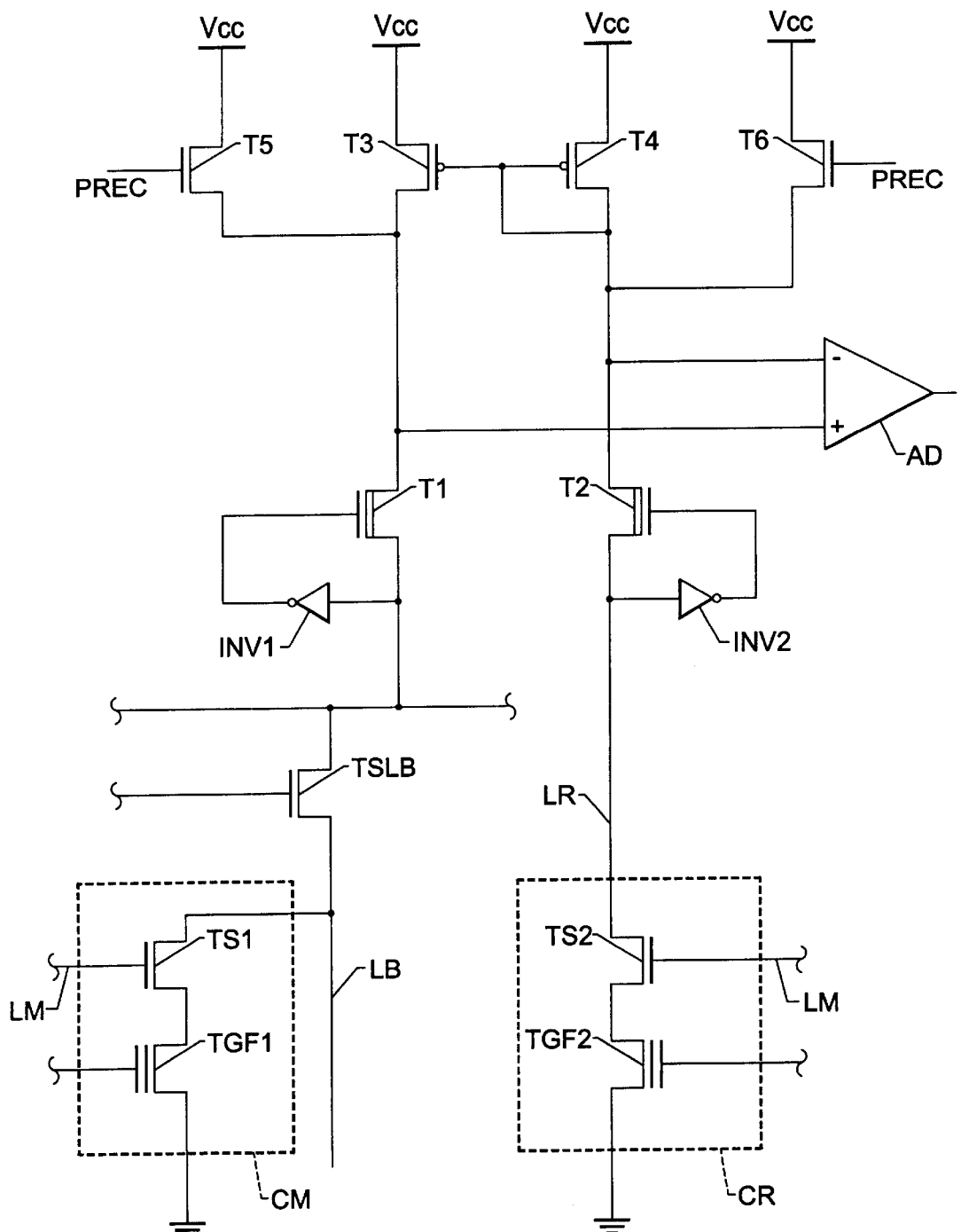
FIG. 1, already described, shows a prior art read circuit.

The precharging means works as follows: outside the precharging phase, the signal PREC has a low level. The output of the NAND gate has a high level and the precharging transistors T7 and T8 are then off. During the precharging phase, the signal PREC is active and the NAND gate delivers a low-level signal. The precharging transistors are then conductive and the precharging potential of the bit line LB and of the reference line LR starts rising. So long as the precharging potential is below 1 volt, the transistors T9 and T10 are off. Preferably, the precharging means are complemented by an equalizing transistor T13 to equalize the potentials of the bit line and the reference line. In the drawing of FIG. 1, this transistor is controlled by the control signal of the precharging transistors. The equalizing is therefore performed during the precharging step.

As soon as the precharging potential of the lines LB and LR reach 1 volt, the transistors T9 and T10 become conductive and the transistor T10 imposes a very low potential, close to the ground potential, on one of the inputs of the NAND gate. So that this potential may remain low when the transistor T11 is conductive, the transistor T11 is preferably chosen to be very resistive. The output of the NAND gate goes back to the high level and the precharging of the lines LB and LR is then interrupted.

Figure 3:
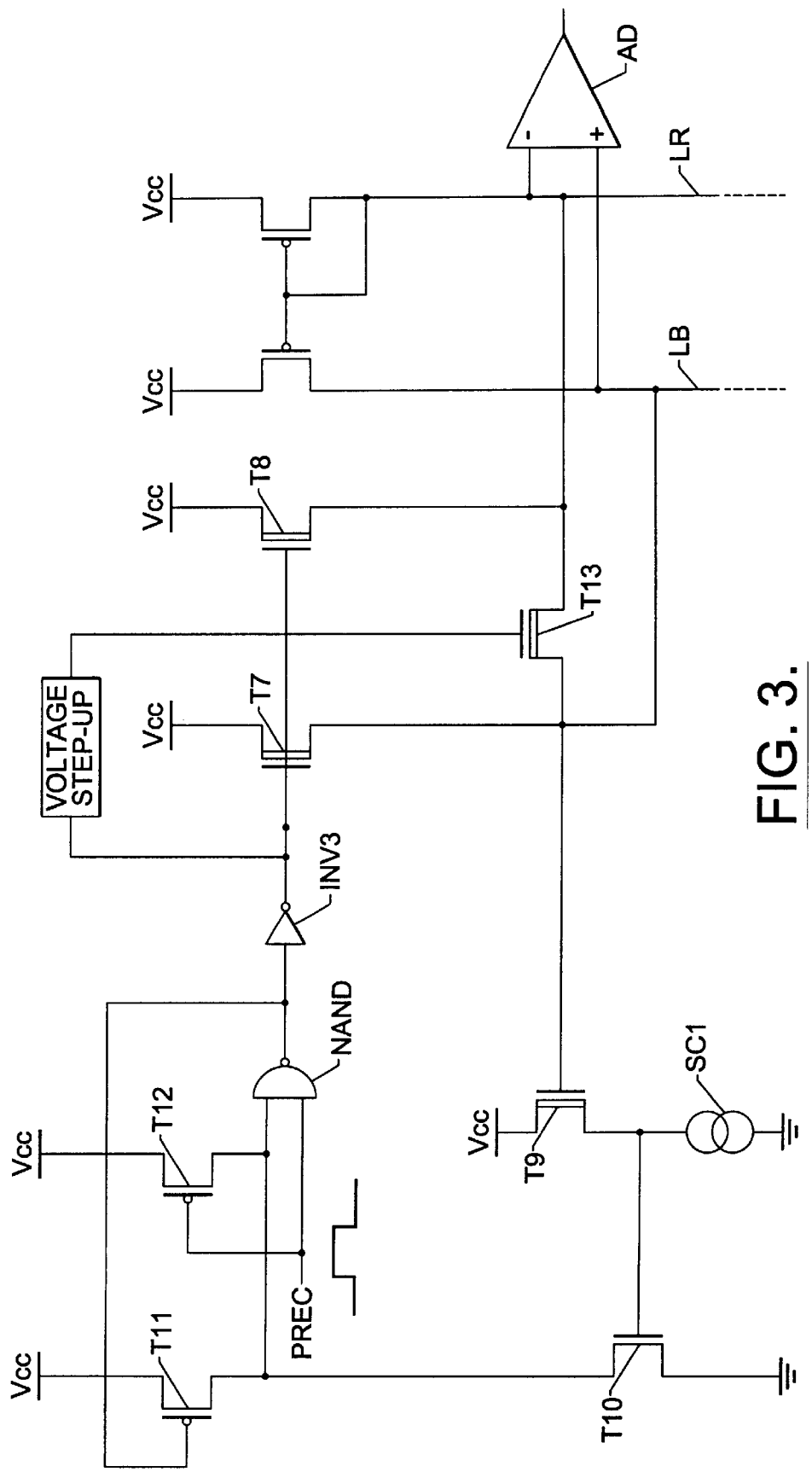
FIG. 3 shows a variant of the read circuit according to the invention.

Should the read circuit be supplied by a low supply voltage, for example 1.8 volts, the precharging means is complemented by a voltage step-up or voltage booster circuit to apply a sufficient voltage to the gate of the equalizing transistor. This variant is illustrated at FIG. 3.

What is claimed is:

1. A read circuit for a non-volatile memory of the type comprising a matrix of memory cells, the read circuit being connected, firstly, to said memory cells by at least one bit line and, secondly, to a reference cell by a reference line, the read circuit comprising:

precharging means to precharge the bit line and the reference line, said precharging means comprising interrupt means to interrupt precharging of the bit line and the reference line when a potential of the bit and reference lines reaches a boundary value, a comparison circuit for comparing the precharging potential of the bit line and reference line with the boundary value, the comparison circuit delivering a comparison signal and comprising a first N type transistor having a drain connected to a supply terminal of the read circuit, a gate connected to the bit line, and a source connected to a current source, and a second N type transistor having a gate connected to the source of the first transistor and a source connected to ground, and a drain delivering the comparison signal, precharging transistors to precharge the bit line and reference line, and control means for controlling the precharging transistors responsive to the comparison signal and a precharging signal with a constant period.

2. A read circuit according to claim 1, wherein said interrupt means interrupts precharging when potentials of the bit and reference lines reach a boundary value referenced with respect to ground.

3. A read circuit according to claim 1, wherein the first N type transistor is a native transistor.

4. A read circuit according to claim 3, wherein the control means comprise:

a NAND type gate having a first input connected to the drain of the second N type transistor and a second input receiving the precharging signal with a constant period;

a third P type transistor having a gate and a drain respectively connected to the output of the NAND gate and to the first input of the NAND gate and a source connected to the Vcc supply terminal of the circuit;

a fourth P type transistor having a drain and a gate respectively connected to the first and second inputs of the NAND gate and a source connected to the Vcc supply terminal of the circuit; and an inverter gate having an input connected to the output of the NAND gate and an output connected to the gates of the precharging transistors.

5. A read circuit according to claim 4, wherein the third P type transistor has a relatively high resistance.

6. A read circuit for a non-volatile memory of the type comprising a matrix of memory cells, the read circuit being connected, firstly, to said memory cells by at least one bit line and, secondly, to a reference cell by a reference line, the read circuit comprising:

precharging means to precharge the bit line and the reference line, said precharging means comprising interrupt means to interrupt precharging of the bit line and the reference line when a potential of the bit and reference lines reaches a boundary value, and an equalizing transistor to equalize the potential of the bit line and reference line.

7. A read circuit according to claim 6, wherein the precharging means also comprises voltage step-up means for producing a voltage for the control of the equalizing transistor.

8. A non-volatile memory comprising:

a matrix of memory cells;

a bit line;

a reference line;

a reference cell; and a read circuit being connected, firstly, to said matrix of memory cells by the bit line and, secondly, to the reference cell by the reference line, the read circuit comprising precharging means to precharge the bit line and the reference line, said precharging means comprising interrupt means to interrupt precharging of the bit line and the reference line when a potential of the bit and reference lines reaches a boundary value, a comparison circuit for comparing the precharging potential of the bit line and reference line with the boundary value, the comparison circuit delivering a comparison signal and comprising a first N type transistor having a drain connected to a supply terminal of the read circuit, a gate connected to the bit line, and a source connected to a current source, and a second N type transistor having a gate connected to the source of the first transistor and a source connected to ground, and a drain delivering the comparison signal, precharging transistors to precharge the bit line and reference line, and control means for controlling the precharging transistors responsive to the comparison signal and a precharging signal with a constant period.

9. A memory according to claim 8, wherein said interrupt means interrupts precharging when potentials of the bit and reference lines reach a boundary value referenced with respect to ground.

10. A memory according to claim 8, wherein the first N type transistor is a native transistor.

11. A memory according to claim 10, wherein the control means comprise:

a NAND type gate having a first input connected to the drain of the second N type transistor and a second input receiving the precharging signal with a constant period;

a third P type transistor having a gate and a drain respectively connected to the output and to the first input of the NAND gate and a source connected to the supply terminal of the circuit;

a fourth P type transistor having a drain and a gate respectively connected to the first and second inputs of the NAND gate and a source connected to the supply terminal of the circuit; and an inverter gate having an input connected to the output of the NAND gate and an output connected to the gates of the precharging transistors.

12. A memory according to claim 11, wherein the third P type transistor has a relatively high resistance.

13. A non-volatile memory comprising:

a matrix of memory cells;

a bit line;

a reference line;

a reference cell; and a read circuit being connected, firstly, to said matrix of memory cells by the bit line and, secondly, to the reference cell by the reference line, the read circuit comprising precharging means to precharge the bit line and the reference line, said precharging means comprising interrupt means to interrupt precharging of the bit line and the reference line when a potential of the bit and reference lines reaches a boundary value, and an equalizing transistor to equalize the potential of the bit line and reference line.

14. A memory according to claim 13, wherein the precharging means also comprises voltage step-up means for producing a voltage for the control of the equalizing transistor.

15. A method for reading a non-volatile memory of the type comprising a matrix of memory cells and using a read circuit being connected, firstly, to the memory cells by at least one bit line and, secondly, to a reference cell by a reference line, the method comprising the steps of:

precharging the bit line and the reference line, the step of precharging comprising comparing the precharging potential of the bit line and reference line with the boundary value and generating a comparison signal responsive thereto, precharging transistors to precharge the bit line and reference line, controlling the precharging transistors responsive to the comparison signal and a precharging signal with a constant period, and equalizing the potential of the bit line and reference line; and interrupting precharging of the bit line and the reference line based upon a potential of the bit and reference lines reaching a boundary value.

16. A method according to claim 15, wherein the step of interrupting comprises interrupting the precharging when potentials of the bit and reference lines reach a boundary value referenced with respect to ground.

17. A method according to claim 15, wherein the step of equalizing further comprises stepping up a voltage for an equalizing transistor.

* * * * *